(12) United States Patent
Lee et al.

(10) Patent No.: US 11,663,971 B2
(45) Date of Patent: May 30, 2023

(54) PIXEL CIRCUIT AND DISPLAY DEVICE INCLUDING THE SAME

(71) Applicant: LG Display Co., Ltd., Seoul (KR)

(72) Inventors: Yong Won Lee, Paju-si (KR); Hyun Soo Lee, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 17/855,290

(22) Filed: Jun. 30, 2022

(65) Prior Publication Data

US 2023/0009834 A1     Jan. 12, 2023

(30) Foreign Application Priority Data

Jul. 8, 2021  (KR) .................. 10-2021-0090004
Dec. 21, 2021  (KR) .................. 10-2021-0183586

(51) Int. Cl.
*G09G 3/3233* (2016.01)
*H10K 59/131* (2023.01)

(52) U.S. Cl.
CPC ......... *G09G 3/3233* (2013.01); *H10K 59/131* (2023.02); *G09G 2300/0413* (2013.01); *G09G 2300/0426* (2013.01); *G09G 2300/0819* (2013.01); *G09G 2300/0842* (2013.01); *G09G 2310/08* (2013.01); *G09G 2330/02* (2013.01); *H10K 59/88* (2023.02)

(58) Field of Classification Search
CPC .............. G09G 3/3233; G09G 3/3291; G09G 2310/08; G09G 2330/02; G09G 2300/0413; G09G 2300/0426; H10K 59/131; H10K 59/88
See application file for complete search history.

(56) References Cited

U.S. PATENT DOCUMENTS 10,733,940 B2   8/2020 Lee
2019/0096336 A1*  3/2019 Lee ....................... G09G 3/3291

FOREIGN PATENT DOCUMENTS

KR  10-2017-0065090 A   6/2017
KR  10-2019-0036841 A   4/2019
KR  10-2020-0036415 A   4/2020

* cited by examiner

*Primary Examiner* — Sardis F Azongha
(74) *Attorney, Agent, or Firm* — Fenwick & West LLP

(57) ABSTRACT

A pixel circuit and a display device including the pixel circuit are disclosed. The pixel circuit according to embodiments includes a first pixel circuit connected in parallel to an initialization voltage line to which an initialization voltage is applied, and including a first-first switch element connected to a first-first gate line and a first-second switch element connected to a first-second gate line; and a second pixel circuit connected in parallel to the initialization voltage line, and including a second-first switch element connected to a second-first gate line and a second-second switch element connected to a second-second gate line, and the first-second gate line and the second-first gate line are electrically connected.

21 Claims, 15 Drawing Sheets

FIG. 6

|  | horizontal pixels | vertical pixels | Frequency (Hz) | 1H Time(us) | Initial Time(us) | arrangment interval |
|---|---|---|---|---|---|---|
| Resolution 1 | 1920 | 1080 | 60 | 15.43 | 300 | 20 |
|  | 1920 | 1080 | 60 | 15.43 | 150 | 10 |
|  | 1920 | 1080 | 144 | 6.43 | 300 | 47 |
|  | 1920 | 1080 | 144 | 6.43 | 150 | 24 |
| Resolution 2 | 2560 | 1440 | 60 | 11.57 | 300 | 26 |
|  | 2560 | 1440 | 60 | 11.57 | 150 | 13 |
|  | 2560 | 1440 | 144 | 4.82 | 300 | 63 |
|  | 2560 | 1440 | 144 | 4.82 | 150 | 32 |
| Resolution 3 | 3840 | 1440 | 60 | 11.57 | 300 | 26 |
|  | 3840 | 1440 | 60 | 11.57 | 150 | 13 |
|  | 3840 | 1440 | 144 | 4.82 | 300 | 63 |
|  | 3840 | 1440 | 144 | 4.82 | 150 | 32 |

PIXEL CIRCUIT AND DISPLAY DEVICE INCLUDING THE SAME

CROSS-REFERENCE TO RELATED APPLICATION

This application claims priority to and the benefit of Republic of Korea Patent Application No. 10-2021-0090004, filed Jul. 8, 2021, and Republic of Korea Patent Application No. 10-2021-0183586, filed Dec. 21, 2021, each of which is hereby incorporated by reference in its entirety.

BACKGROUND

1. Field

The present disclosure relates to a pixel circuit and a display device including the same.

2. Discussion of Related Art

Display devices includes a liquid crystal display (LCD) device, an electroluminescence display device, a field emission display (FED) device, a plasma display panel (PDP), and the like.

Electroluminescent display devices are divided into inorganic light emitting display devices and organic light emitting display devices according to a material of a light emitting layer. An active-matrix type organic light emitting display device reproduces an input image using a self-emissive element which emits light by itself, for example, an organic light emitting diode (hereinafter referred to as an "OLED"). An organic light emitting display device has advantages in that a response speed is fast and luminous efficiency, luminance, and a viewing angle are large.

Some display devices, for example, a liquid crystal display device or an organic light emitting display device include a display panel including a plurality of sub-pixels, a driver outputting a driving signal for driving the display panel, a power supply generating power to be supplied to the display panel or the driver, and the like. The driver includes a gate driver that supplies a scan signal or a gate signal to the display panel, and a data driver that supplies a data signal to the display panel.

In such a display device, when a driving signal such as a scan signal, an emission EM signal, and a data signal is supplied to a plurality of sub-pixels formed in the display panel, the selected sub-pixel transmits light or emits light directly to thereby display an image.

However, because a planar cathode electrode structure is applied to all pixels in the display panel, the influence of a low-potential power supply voltage (EVSS) ripple is high. That is, a pixel line pair to which a scan pulse and a sensing pulse are simultaneously applied in pixels applying an internal compensation circuit is affected by each other's low-potential power supply voltage ripple during voltage charging. Such a low-potential power supply voltage ripple is generated when the voltage of a source node of a driving element is rapidly changed.

SUMMARY

The present disclosure provides a pixel circuit for reducing a low-potential power supply voltage ripple by preventing the voltage of the source node from changing rapidly and also provides a display device including the same.

It should be noted that objects of the present disclosure are not limited to the above-described objects, and other objects of the present disclosure will be apparent to those skilled in the art from the following descriptions.

A pixel circuit according to the present disclosure includes a first pixel circuit connected in parallel to an initialization voltage line to which an initialization voltage is applied, and including a first-first switch element connected to a first-first gate line and a first-second switch element connected to a first-second gate line; and a second pixel circuit connected in parallel to the initialization voltage line, and including a second-first switch element connected to a second-first gate line and a second-second switch element connected to a second-second gate line, and the first-second gate line and the second-first gate line are electrically connected.

A display device according to the present disclosure includes a display panel in which a plurality of sub-pixels are disposed, wherein each sub-pixels includes: a first pixel circuit connected in parallel to an initialization voltage line to which an initialization voltage is applied, and including a first-first switch element connected to a first-first gate line and a first-second switch element connected to a first-second gate line; and a second pixel circuit connected in parallel to the initialization voltage line, and including a second-first switch element connected to a second-first gate line and a second-second switch element connected to a second-second gate line, wherein the first-second gate line and the second-first gate line are electrically connected.

A pixel circuit according to the present disclosure includes a first switch element and a second switch element which are connected in parallel to an initialization voltage line to which the initialization voltage is applied, wherein the first switch element and the second switch element are applied with a initialization pulse, and the pixel circuit is configured to share the initialization pulse with another pixel circuit which is spaced apart from the pixel circuit by a predetermined number of pixel lines.

According to the present disclosure, by connecting two switch elements in parallel to the initialization voltage line to which the initialization voltage is applied, a drop gap of the voltage of the source node of the driving element can be reduced through two initialization sections, and thereby a low-potential power supply voltage ripple occurring upon voltage charging can be reduced.

The present disclosure can minimize or at least reduce the in-plane charging unevenness by reducing the low-potential power supply voltage ripple.

The effects of the present disclosure are not limited to the above-mentioned effects, and other effects that are not mentioned will be apparently understood by those skilled in the art from the following description and the appended claims.

BRIEF DESCRIPTION OF THE DRAWINGS

The above and other objects, features, and advantages of the present disclosure will become more apparent to those of ordinary skill in the art by describing exemplary embodiments thereof in detail with reference to the attached drawings, in which:

FIGS. 5 and 6 are diagrams illustrating a connection principle of a pixel circuit according to an embodiment of the present disclosure;

DETAILED DESCRIPTION

Figure 1:
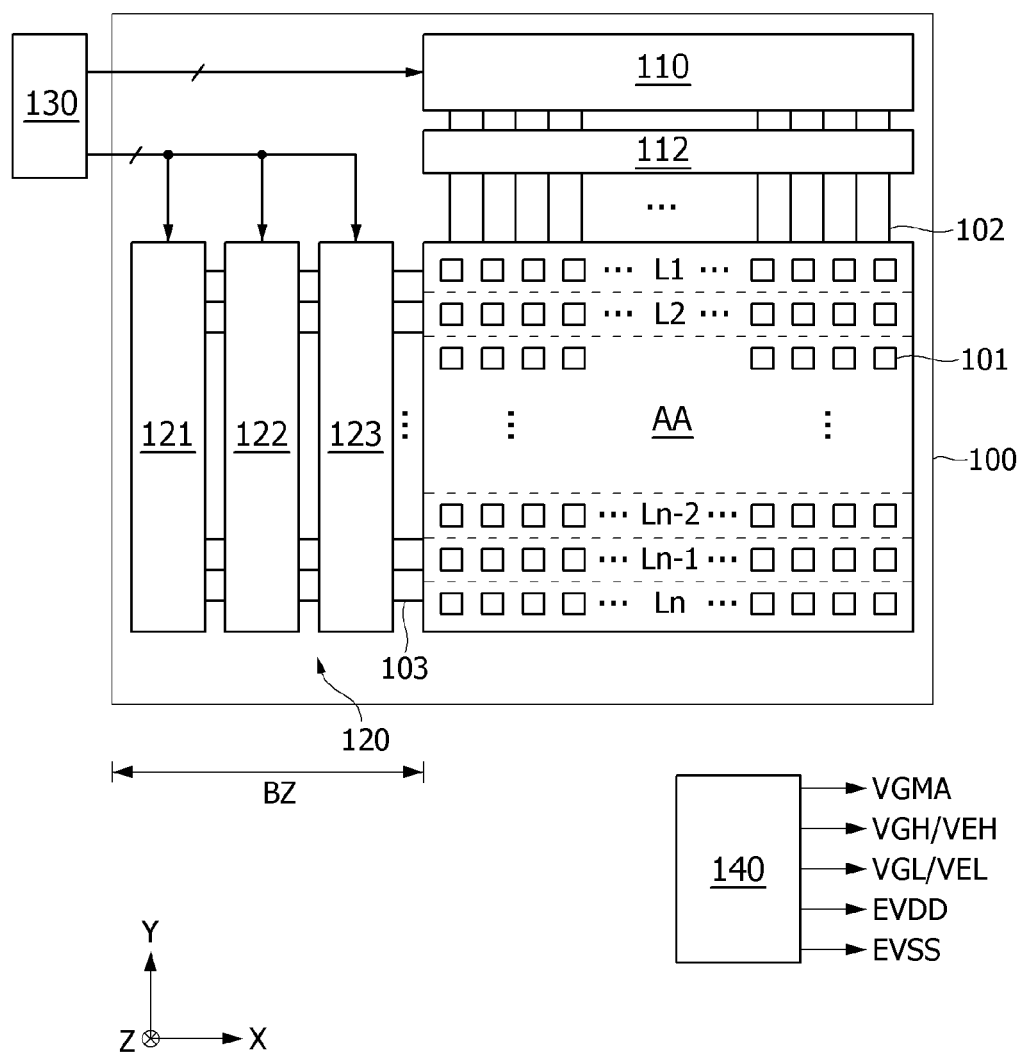
FIG. 1 is a block diagram illustrating a display device according to an embodiment of the present disclosure.

The advantages and features of the present disclosure and methods for accomplishing the same will be more clearly understood from embodiments described below with reference to the accompanying drawings. However, the present disclosure is not limited to the following embodiments but may be implemented in various different forms. Rather, the present embodiments will make the disclosure of the present disclosure complete and allow those skilled in the art to completely comprehend the scope of the present disclosure. The present disclosure is only defined within the scope of the accompanying claims.

The shapes, sizes, ratios, angles, numbers, and the like illustrated in the accompanying drawings for describing the embodiments of the present disclosure are merely examples, and the present disclosure is not limited thereto. Like reference numerals generally denote like elements throughout the present specification. Further, in describing the present disclosure, detailed descriptions of known related technologies may be omitted to avoid unnecessarily obscuring the subject matter of the present disclosure.

The terms such as "comprising," "including," and "having" used herein are generally intended to allow other components to be added unless the terms are used with the term "only." Any references to singular may include plural unless expressly stated otherwise.

Components are interpreted to include an ordinary error range even if not expressly stated.

When the position relation between two components is described using the terms such as "on," "above," "below," and "next," one or more components may be positioned between the two components unless the terms are used with the term "immediately" or "directly."

The terms "first," "second," and the like may be used to distinguish components from each other, but the functions or structures of the components are not limited by ordinal numbers or component names in front of the components.

The same reference numerals may refer to substantially the same elements throughout the present disclosure.

The following embodiments can be partially or entirely bonded to or combined with each other and can be linked and operated in technically various ways. The embodiments can be carried out independently of or in association with each other.

Hereinafter, various embodiments of the present disclosure will be described in detail with reference to the accompanying drawings.

Figure 2:
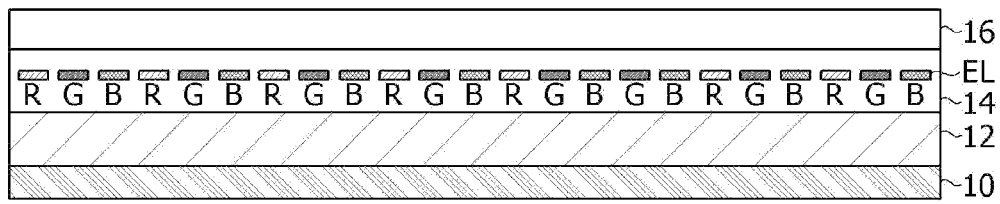
FIG. 2 is a diagram illustrating a cross-sectional structure of the display panel shown in FIG. 1 according to an embodiment of the present disclosure.

FIG. 1 is a block diagram illustrating a display device according to an embodiment of the present disclosure, and FIG. 2 is a diagram illustrating a cross-sectional structure of the display panel shown in FIG. 1 according to an embodiment of the present disclosure.

Referring to FIG. 1, the display device according to an embodiment of the present disclosure includes a display panel 100, a display panel driving circuit for writing pixel data to pixels of the display panel 100, and a power supply 140 for generating power necessary for driving the pixels and the display panel driving circuit.

The display panel 100 includes a pixel array AA that displays an input image. The pixel array AA includes a plurality of data lines 102, a plurality of gate lines 103 that intersect with the data lines 102, and pixels arranged in a matrix form.

The pixel array AA includes a plurality of pixel lines L1 to Ln. Each of the pixel lines L1 to Ln includes one line of pixels arranged along a line direction X in the pixel array AA of the display panel 100. Pixels arranged in one pixel line share the gate lines 103. Sub-pixels arranged in a column direction Y along a data line direction share the same data line 102. One horizontal period 1H is a time obtained by dividing one frame period by the total number of pixel lines L1 to Ln.

Touch sensors may be disposed on the display panel 100. A touch input may be sensed using separate touch sensors or may be sensed through pixels. The touch sensors may be disposed as an on-cell type or an add-on type on the screen of the display panel or implemented as in-cell type touch sensors embedded in the pixel array AA.

The display panel 100 may be implemented as a flexible display panel. The flexible display panel may be made of a plastic OLED panel. An organic thin film may be disposed on a back plate of the plastic OLED panel, and the pixel array AA may be formed on the organic thin film.

The back plate of the plastic OLED may be a polyethylene terephthalate (PET) substrate. The organic thin film is formed on the back plate. The pixel array AA and a touch sensor array may be formed on the organic thin film. The back plate blocks moisture permeation so that the pixel array AA is not exposed to humidity. The organic thin film may be a thin polyimide (PI) film substrate. A multi-layered buffer film may be formed of an insulating material (not shown) on the organic thin film. Lines may be formed on the organic thin film so as to supply power or signals applied to the pixel array AA and the touch sensor array.

To implement color, each of the pixels may be divided into a red sub-pixel (hereinafter referred to as "R sub-pixel"), a green sub-pixel (hereinafter referred to as "G sub-pixel"), and a blue sub-pixel (hereinafter referred to as "B sub-pixel"). Each of the pixels may further include a white sub-pixel. Each of the sub-pixels 101 includes a pixel circuit. The pixel circuit is connected to the data line 102 and the gate line 103.

Hereinafter, a pixel may be interpreted as having the same meaning as a sub-pixel.

As shown in FIG. 2, when viewed from a cross-sectional structure, the display panel 100 may include a circuit layer 12, a light emitting element layer 14, and an encapsulation layer 16 stacked on a substrate 10.

The circuit layer 12 may include a pixel circuit connected to wirings such as a data line, a gate line, and a power line, a gate driver (GIP) connected to the gate lines, a de-multiplexer array 112, a circuit (not shown) for auto probe inspection, and the like. The wirings and circuit elements of the circuit layer 12 may include a plurality of insulating layers, two or more metal layers separated with the insulating layer therebetween, and an active layer including a semiconductor material. All transistors formed in the circuit layer 12 may be implemented as oxide TFTs having an n-channel type oxide semiconductor.

The light emitting element layer 14 may include a light emitting element EL driven by a pixel circuit. The light emitting element EL may include a red (R) light emitting element, a green (G) light emitting element, and a blue (B) light emitting element. The light emitting element layer 14 may include a white light emitting element and a color filter. The light emitting elements EL of the light emitting element layer 14 may be covered by a protective layer including an organic film and a passivation film.

The encapsulation layer 16 covers the light emitting element layer 14 to seal the circuit layer 12 and the light emitting element layer 14. The encapsulation layer 16 may have a multilayered insulating structure in which an organic film and an inorganic film are alternately stacked. The inorganic film blocks or at least reduces the penetration of moisture and oxygen. The organic film planarizes the surface of the inorganic film. When the organic film and the inorganic film are stacked in multiple layers, a movement path of moisture or oxygen becomes longer compared to a single layer, so that penetration of moisture and oxygen affecting the light emitting element layer 14 can be effectively blocked or at least reduced.

A touch sensor layer may be disposed on the encapsulation layer 16. The touch sensor layer may include capacitive type touch sensors that sense a touch input based on a change in capacitance before and after the touch input. The touch sensor layer may include metal wiring patterns and insulating layers forming the capacitance of the touch sensors. The capacitance of the touch sensor may be formed between the metal wiring patterns. A polarizing plate may be disposed on the touch sensor layer. The polarizing plate may improve visibility and contrast ratio by converting the polarization of external light reflected by metal of the touch sensor layer and the circuit layer 12. The polarizing plate may be implemented as a polarizing plate in which a linear polarizing plate and a phase delay film are bonded, or a circular polarizing plate. A cover glass may be adhered to the polarizing plate.

The display panel 100 may further include a touch sensor layer and a color filter layer stacked on the encapsulation layer 16. The color filter layer may include red, green, and blue color filters and a black matrix pattern. The color filter layer may replace the polarizing plate and increase the color purity by absorbing a part of the wavelength of light reflected from the circuit layer and the touch sensor layer. In this embodiment, by applying the color filter layer 20 having a higher light transmittance than the polarizing plate to the display panel, the light transmittance of the display panel PNL can be improved, and the thickness and flexibility of the display panel PNL can be improved. A cover glass may be adhered on the color filter layer.

The power supply 140 generates direct current (DC) power required for driving the pixel array AA and the display panel driving circuit of the display panel 100 by using a DC-DC converter included in the power supply 140. The DC-DC converter may include a charge pump, a regulator, a buck converter, a boost converter, and the like. The power supply 140 may adjust a DC input voltage from a host system (not shown) and thereby generate DC voltages such as a gamma reference voltage VGMA, gate-on voltages VGH and VEH, gate-off voltages VGL and VEL, a pixel driving voltage EVDD, and a pixel low-potential power supply voltage EVSS. The gamma reference voltage VGMA is supplied to a data driver 110. The gate-on voltages VGH and VEH and the gate-off voltages VGL and VEL are supplied to a gate driver 120. The pixel driving voltage EVDD and the pixel low-potential power supply voltage EVSS are commonly supplied to the pixels.

The display panel driving circuit writes pixel data (digital data) of an input image to the pixels of the display panel 100 under the control of a timing controller (TCON) 130.

The display panel driving circuit includes the data driver 110 and the gate driver 120.

A de-multiplexer (DEMUX) 112 may be disposed between the data driver 110 and the data lines 102. The de-multiplexer 112 sequentially connects one channel of the data driver 110 to the plurality of data lines 102 and distributes in a time division manner the data voltage outputted from one channel of the data driver 110 to the data lines 102, thereby reducing the number of channels of the data driver 110. The de-multiplexer array 112 may be omitted. In this case, output buffers AMP of the data driver 110 are directly connected to the data lines 102.

The display panel driving circuit may further include a touch sensor driver for driving the touch sensors. The touch sensor driver is omitted from FIG. 1. In a mobile device, the timing controller 130, the power supply 140, the data driver 110, and the like may be integrated into one drive integrated circuit (IC).

The data driver 110 generates a data voltage Vdata by converting pixel data of an input image received from the timing controller 130 with a gamma compensation voltage every frame period by using a digital to analog converter (DAC). The gamma reference voltage VGMA is divided for respective gray scales through a voltage divider circuit. The gamma compensation voltage divided from the gamma reference voltage VGMA is provided to the DAC of the data driver 110. The data voltage Vdata is outputted through the output buffer AMP in each of the channels of the data driver 110.

In the data driver 110, the output buffer AMP included in one channel may be connected to adjacent data lines 102 through the de-multiplexer array 112. The de-multiplexer array 112 may be formed directly on the substrate of the display panel 100 or integrated into one drive IC together with the data driver 110.

The gate driver 120 may be implemented as a gate in panel (GIP) circuit formed directly on a bezel BZ area of the display panel 100 together with the TFT array of the pixel array AA. The gate driver 120 sequentially outputs gate signals to the gate lines 103 under the control of the timing controller 130. The gate driver 120 may sequentially supply the gate signals to the gate lines 103 by shifting the gate signals using a shift register.

The gate signal may include a scan signal for selecting pixels of a line in which data is to be written in synchronization with the data voltage, and an EM signal defining an emission time of pixels charged with the data voltage.

The gate driver 120 may include a scan driver 121, an EM driver 122, and an initialization driver 123.

The scan driver 121 outputs a scan signal SCAN in response to a start pulse and a shift clock from the timing controller 130, and shifts the scan signal SCAN according to the shift clock timing. The EM driver 122 outputs an EM signal EM in response to a start pulse and a shift clock from the timing controller 130, and sequentially shifts the EM signal EM according to the shift clock. The initialization driver 123 outputs an initialization signal INIT in response to a start pulse and a shift clock from the timing controller 130, and shifts the initialization signal INIT according to the shift clock timing. Therefore, the scan signal SCAN, the EM signal EM, and the initialization signal INIT are sequentially supplied to the gate lines 103 of the pixel lines L1 to Ln. In case of a bezel-free model, at least some of transistors constituting the gate driver 120 and clock wirings may be dispersedly disposed in the pixel array AA.

The timing controller 130 receives, from a host system (not shown), digital video data DATA of an input image and a timing signal synchronized therewith. The timing signal includes a vertical synchronization signal Vsync, a horizontal synchronization signal Hsync, a main clock CLK, a data enable signal DE, and the like. Because a vertical period and a horizontal period can be known by counting the data enable signal DE, the vertical synchronization signal Vsync and the horizontal synchronization signal Hsync may be omitted. The data enable signal DE has a cycle of one horizontal period (1H).

The host system may be any one of a television (TV) system, a set-top box, a navigation system, a personal computer (PC), a home theater system, a vehicle system, and a mobile device system.

The timing controller 130 multiplies an input frame frequency by i and controls the operation timing of the display panel driving circuit with a frame frequency of the input frame frequency×i (i is a positive integer greater than 0) Hz. The input frame frequency is 60 Hz in the NTSC (National Television Standards Committee) scheme and 50 Hz in the PAL (phase-alternating line) scheme.

Based on the timing signals Vsync, Hsync, and DE received from the host system, the timing controller 130 generates a data timing control signal for controlling the operation timing of the data driver 110, MUX signals MUX1 and MUX2 for controlling the operation timing of the de-multiplexer array 112, and a gate timing control signal for controlling the operation timing of the gate driver 120.

The voltage level of the gate timing control signal outputted from the timing controller 130 may be converted into the gate-on voltages VGH and VEH and the gate-off voltages VGL and VEL through a level shifter (not shown) and then supplied to the gate driver 120. That is, the level shifter converts a low level voltage of the gate timing control signal into the gate-off voltages VGL and VEL and converts a high level voltage of the gate timing control signal into the gate-on voltages VGH and VEH. The gate timing signal includes the start pulse and the shift clock.

In embodiments of the present disclosure, an initialization transistor is added to reduce a defect that a low-potential power supply voltage ripple affects charging, and a pre-initialization section is added before the initialization section to improve a low-potential power supply voltage ripple generated during charging.

Figure 3:
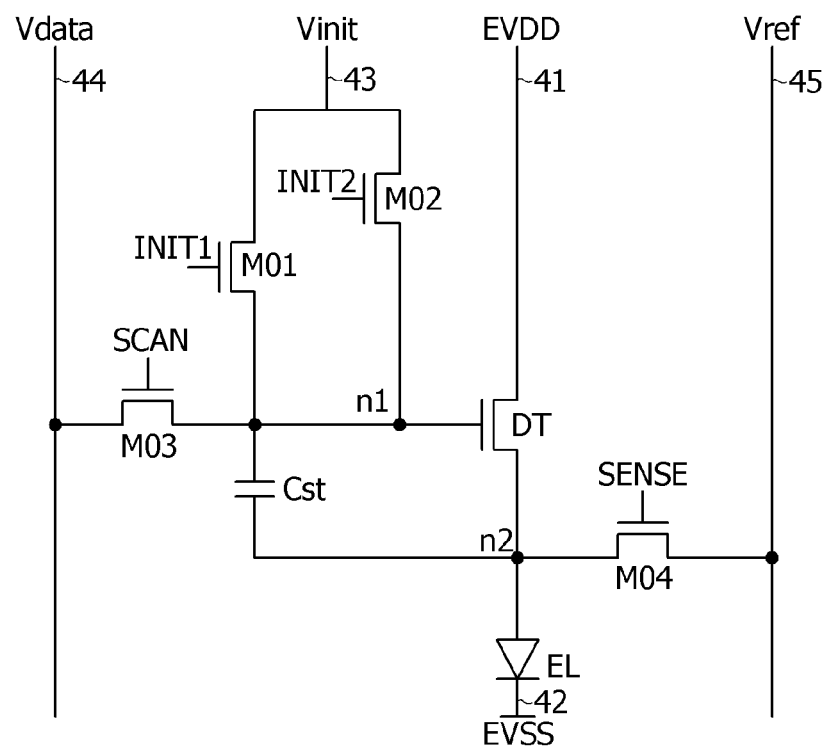
FIG. 3 is a diagram illustrating a pixel circuit according to an embodiment of the present disclosure according to an embodiment of the present disclosure.
Figure 4:
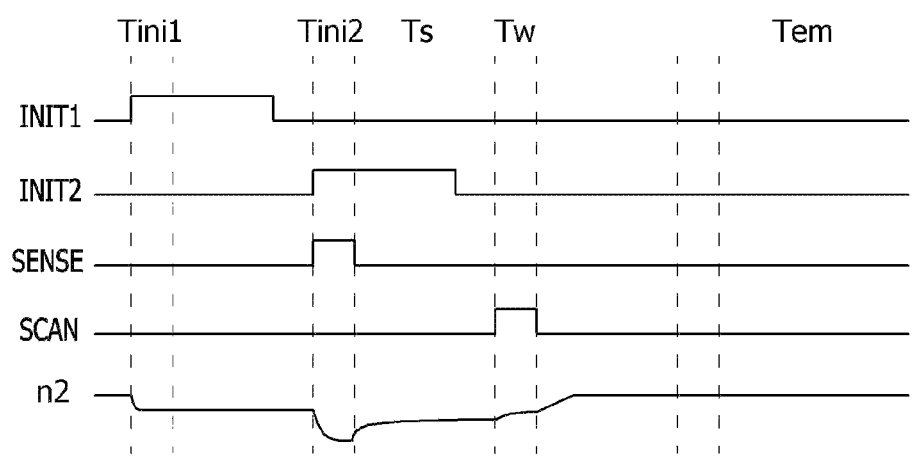
FIG. 4 is a diagram illustrating a driving timing of the pixel circuit shown in FIG. 3 according to an embodiment of the present disclosure.

FIG. 3 is a diagram illustrating a pixel circuit according to an embodiment of the present disclosure, and FIG. 4 is a diagram illustrating a driving timing of the pixel circuit shown in FIG. 3 according to an embodiment of the present disclosure.

Referring to FIGS. 3 and 4, the pixel circuit according to an embodiment of the present disclosure includes a light emitting element EL, a driving element DT for supplying a current to the light emitting element EL, a plurality of switch elements M01, M02, M03, and M04 for switching a current path connected to the driving element DT, and a capacitor Cst for storing a gate-source voltage of the driving element DT. The driving element DT and the plurality of switch elements M01, M02, M03, and M04 may be implemented as an N-channel oxide TFT.

The light emitting element EL emits light by a current applied through a channel of the driving element DT according to a gate-source voltage Vgs of the driving element DT that varies according to a data voltage Vdata. The light emitting element EL may be implemented as an OLED including an organic compound layer formed between an anode and a cathode. The organic compound layer may include, but is not limited to, a hole injection layer (HIL), a hole transport layer (HTL), a light emitting layer (EML), an electron transport layer (ETL), and an electron injection layer (EIL). The anode of the light emitting element EL is connected to the driving element DT through a third node n3, and the cathode of the light emitting element EL is connected to a second power line 42 to which a low-potential power supply voltage EVSS is applied.

An organic light emitting diode used as the light emitting element may have a tandem structure in which a plurality of light emitting layers are stacked. The organic light emitting diode having the tandem structure may improve the luminance and lifespan of the pixel.

The driving element DT drives the light emitting element EL by supplying a current to the light emitting element EL according to the gate-source voltage Vgs. The driving element DT includes a gate electrode connected to a first node n1, a first electrode connected to a first power line 41 to which a pixel driving voltage EVDD is applied, and a second electrode connected to a second node n2.

A first switch element M01 is turned on by a first initialization signal INIT1 and applies an initialization voltage Vinit to the first node n1. The first switch element M01 may be turned on during a first initialization period pre-initial and apply the initialization voltage Vinit to the first node n1. The first switch element M01 includes a first electrode connected to a third power line 43 to which the initialization voltage is applied, a gate electrode to which a first initialization signal is applied, and a second electrode connected to the first node n1.

A second switch element M02 is turned on by a second initialization signal INIT2 and applies the initialization voltage Vinit to the first node n1. The second switch element M02 may be turned on during a second initialization period Initial and apply the initialization voltage Vinit to the first node n1. The second switch element M02 includes a first electrode connected to the third power line 43 to which the initialization voltage is applied, a gate electrode to which a second initialization signal is applied, and a second electrode connected to the first node n1.

A third switch element M03 is turned on by a scan signal SCAN and applies the data voltage to the first node n1. The third switch element M03 includes a first electrode connected to a fourth power line 44 to which the data voltage is applied, a gate electrode to which the scan signal is applied, and a second electrode connected to the first node n1.

A fourth switch element M04 is turned on by a sensing signal SENSE and applies a reference voltage Vref to the second node n2. The fourth switch element M04 includes a first electrode connected to the second node n2, a gate electrode to which the sensing signal is applied, and a second electrode connected to a fifth power line 45 to which the reference voltage is applied.

The capacitor Cst stores the gate-source voltage of the driving element DT. The capacitor is connected between the first node n1 and the second node n2.

As shown in FIG. 4, the pixel circuit may be driven in the order of a first initialization step Tini1, a second initialization step Tini2, a sensing step Ts, a data writing step Tw, and a light emission step Tem.

In the pixel circuit, the first switch element M01 may be turned on and firstly initialize the first node in a first initialization step Tini1, and the second switch element M02 may be turned on and secondly initialize the first node in a second initialization step Tini2. Through two initialization processes using the first switch element M01 and the second switch element M02, that is, the primary initialization process and the secondary initialization process, the source voltage of the driving element DT, that is, the voltage of the second node n2 is lowered twice to reduce its fluctuation range. This can reduce the EVSS ripple occurring during voltage charging.

In the sensing step Ts following the second initialization step Tini2, a threshold voltage Vth of the driving element DT may be sensed and stored in the capacitor Cst. Subsequently, in the data writing step Tw, a data voltage Vdata of pixel data may be applied to the second node n2. Subsequently, in the light emission step Tem, the light emitting element EL may emit light with a luminance corresponding to a gray scale value of the pixel data.

Figure 5:
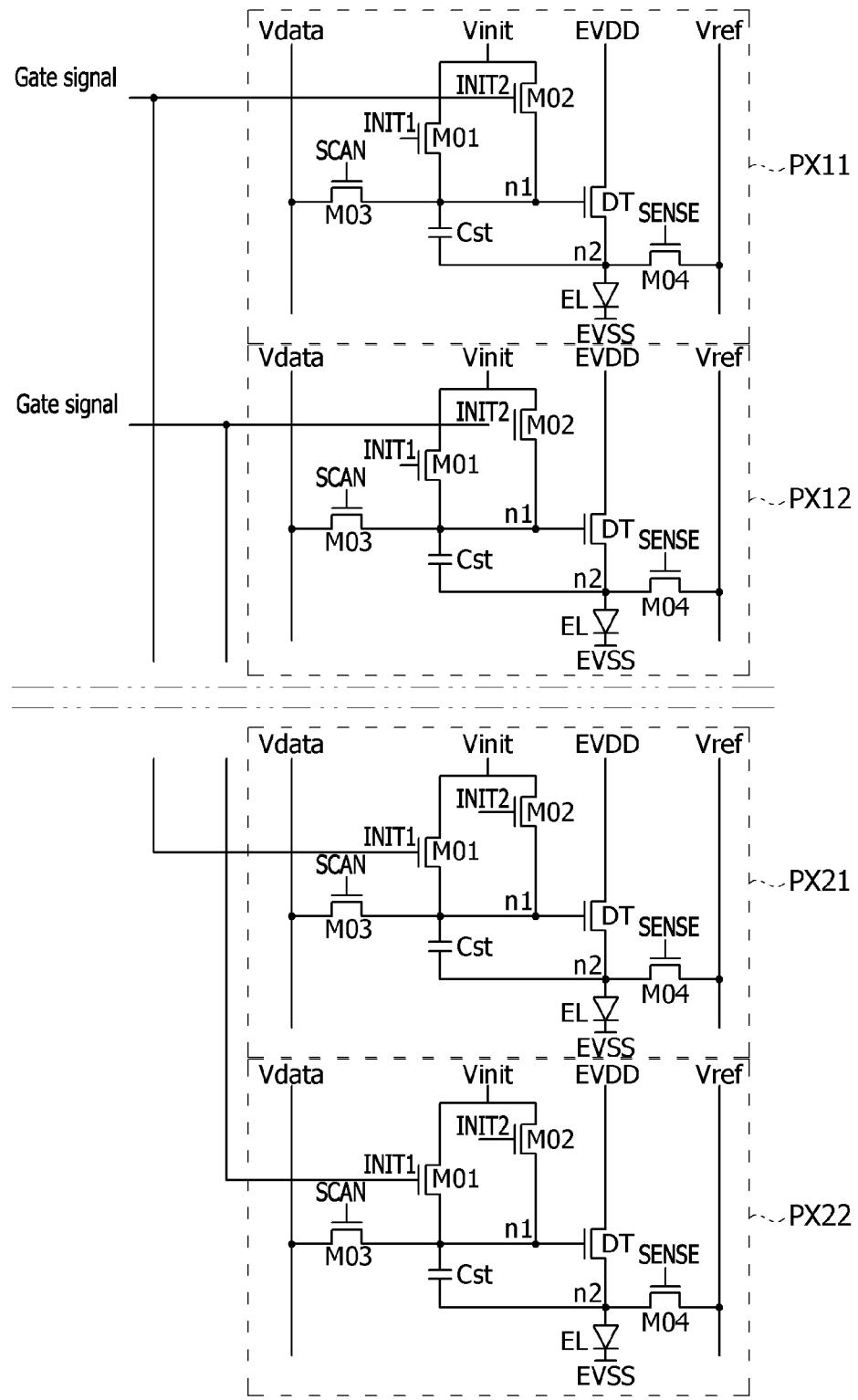

FIGS. 5 and 6 are diagrams illustrating a connection principle of a pixel circuit according to an embodiment of the present disclosure.

Referring to FIG. 5, in the embodiment, an initialization pulse applied to a pixel circuit located in a current pixel line is shared with a pixel circuit located in the next pixel line, thereby initializing the next pixel line.

To this end, a pixel circuit may further include a switch element capable of sharing the initialization pulse with a pixel circuit located in the previous pixel line or the next pixel line. Therefore, the pixel circuit of the embodiment may include two switch elements to which the initialization pulse is applied. The two switch elements are connected in parallel to an initialization voltage line to which the initialization voltage is applied, and are turned on when the initialization pulse is applied, but they may be turned on in different sections.

In one example, when the initialization pulse is applied to the second switch element M02 of the eleventh pixel circuit PX11, the initialization pulse is also applied to the first switch element M01 of the twenty-first pixel circuit PX21, so that the two switch elements can be turned on.

In another example, when the initialization pulse is applied to the second switch element M02 of the twelfth pixel circuit PX12, the initialization pulse is also applied to the first switch element M01 of the twenty-second pixel circuit PX22, so that the two switch elements can be turned on.

In the above cases, the eleventh pixel circuit PX11 and the twenty-first pixel circuit PX21 may be configured to share the initialization pulse, and the twelfth pixel circuit PX12 and the twenty-second pixel circuit PX22 may be configured to share the initialization pulse. In such cases, the pixel circuits sharing the initialization pulse may not be pixel circuits located in adjacent pixel lines, but may be pixel circuits located in pixel lines spaced apart from each other by a certain interval. The reason is to prevent the first initialization section and the second initialization section from overlapping with each other.

As shown in FIG. 6, an arrangement interval between pixel circuits sharing the initialization pulse may be set in consideration of a time of one horizontal period 1H and an initialization time. In this case, the arrangement interval between the pixel circuits may be set equal to or greater than a value obtained by dividing the initialization time by the time of one horizontal period 1H, and may vary depending on resolution, frequency, initialization time, and the like.

For example, in case that the time of one horizontal period is 5 μs and the initialization time is 150 μs, the arrangement interval between two pixel circuits sharing the initialization pulse may be at least 30 (150/5) pixel lines.

Figure 7:
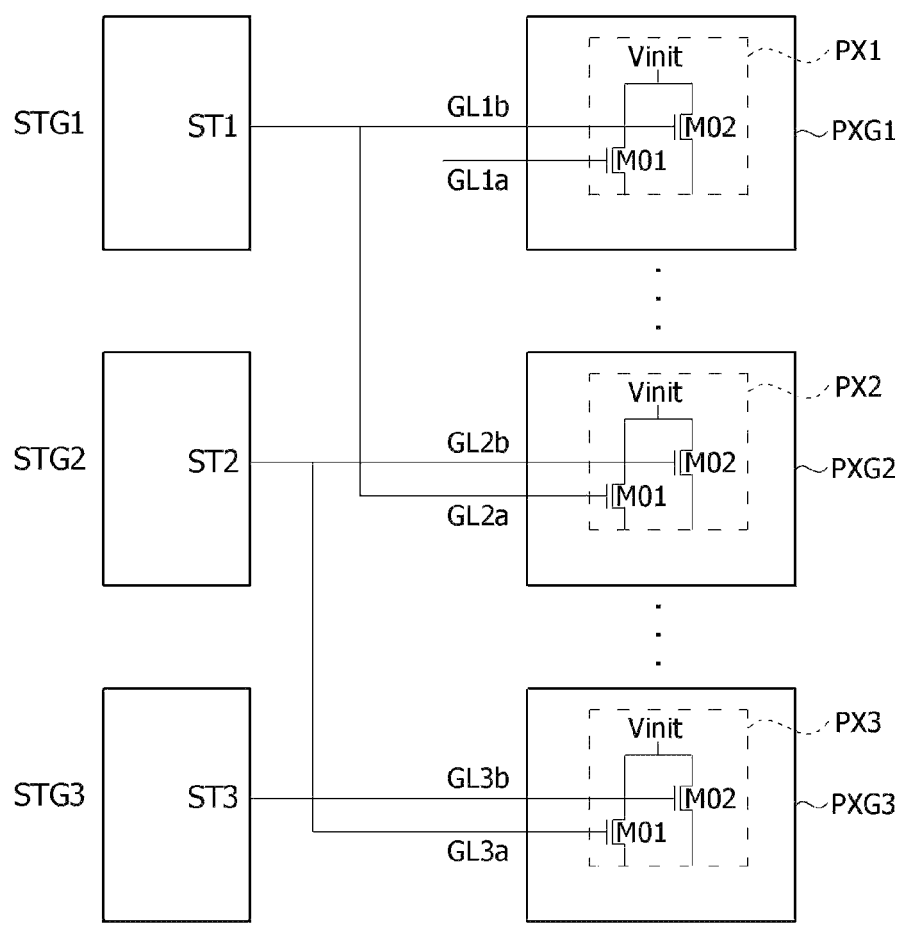
FIG. 7 is a diagram illustrating a connection relationship of a pixel circuit according to a first embodiment of the present disclosure.
Figure 8:
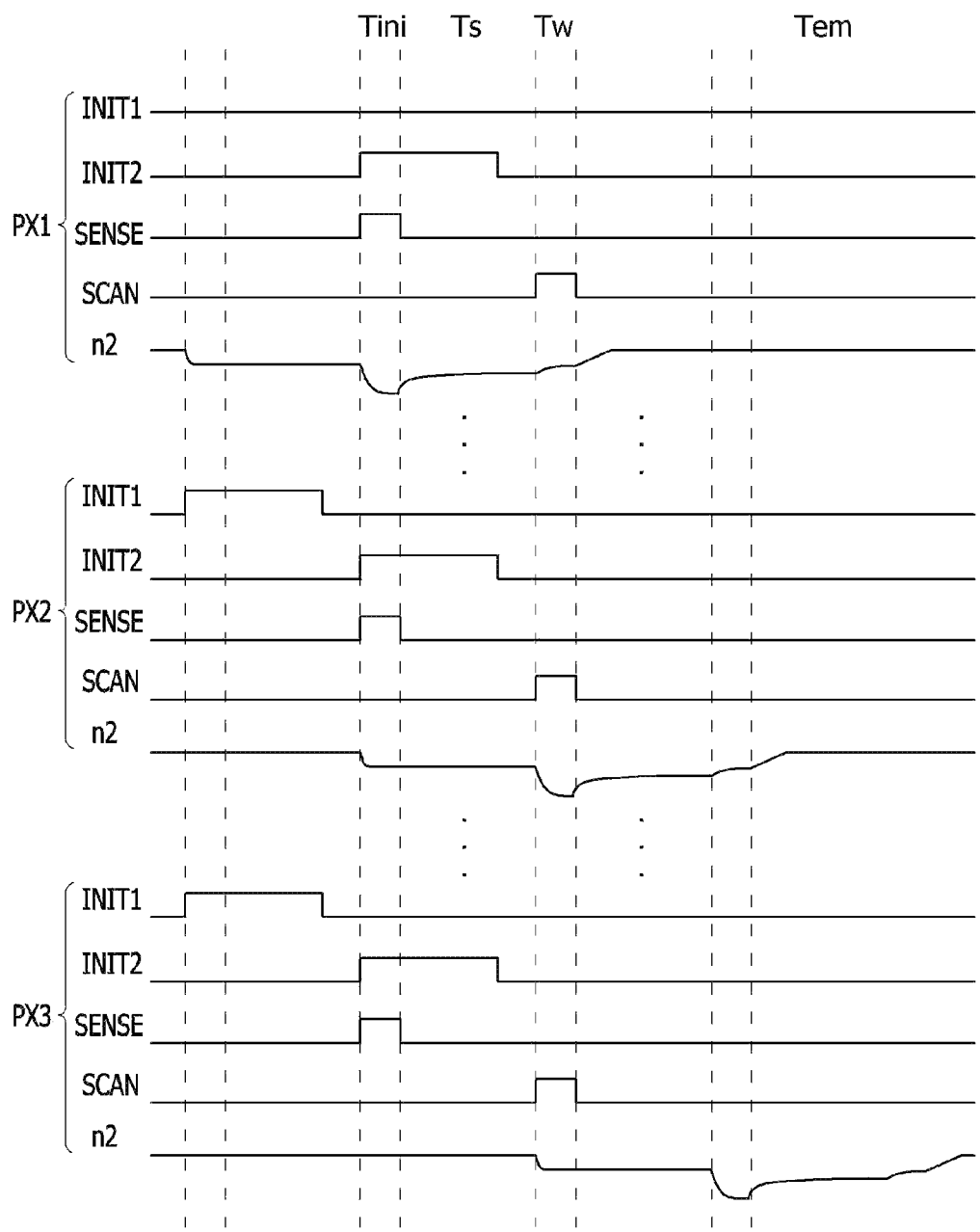
FIG. 8 is a diagram illustrating a driving timing of the pixel circuit shown in FIG. 7 according to the first embodiment of the present disclosure.
Figure 9A:
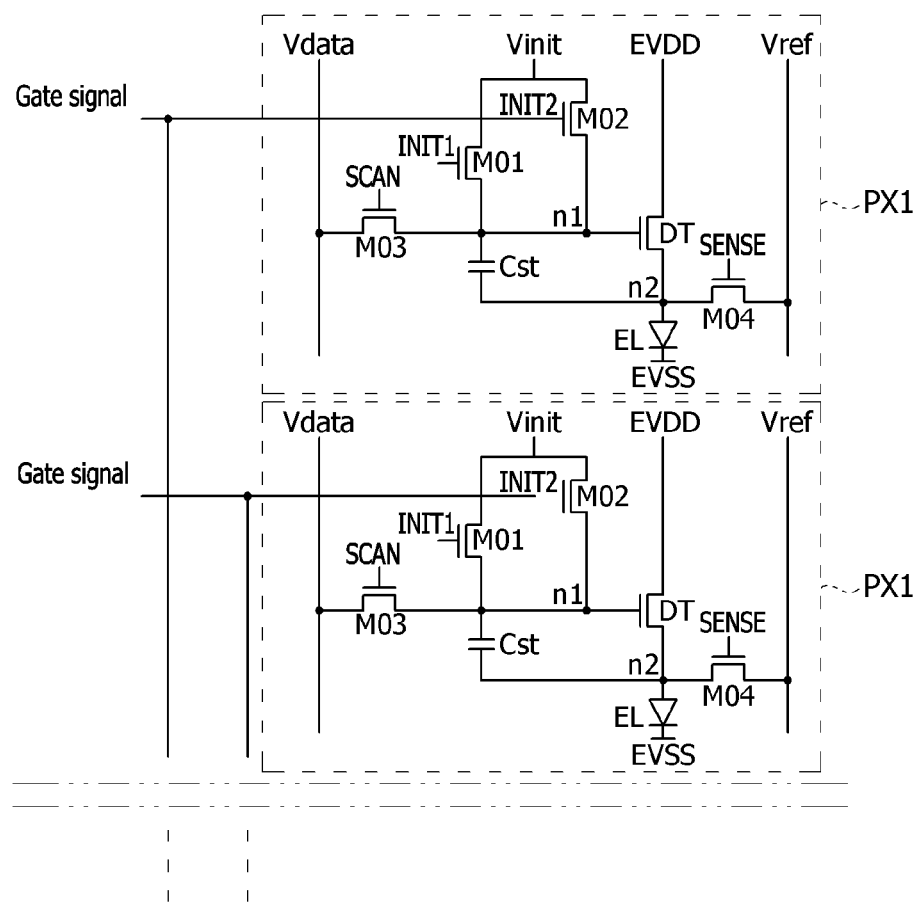
FIGS. 9A to 9C are diagrams illustrating a connection relationship of the pixel circuit shown in FIG. 7 according to the first embodiment of the present disclosure.
Figure 9B:
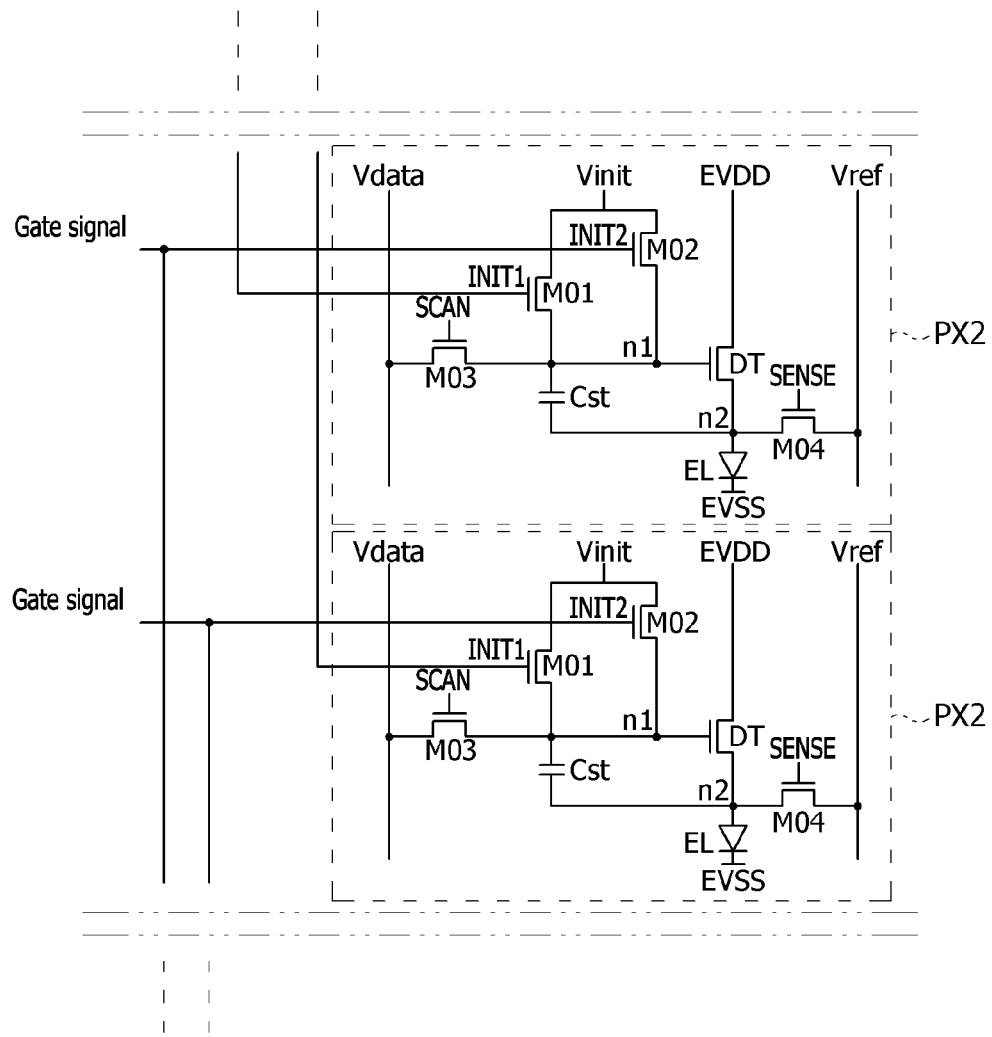
Figure 9C:
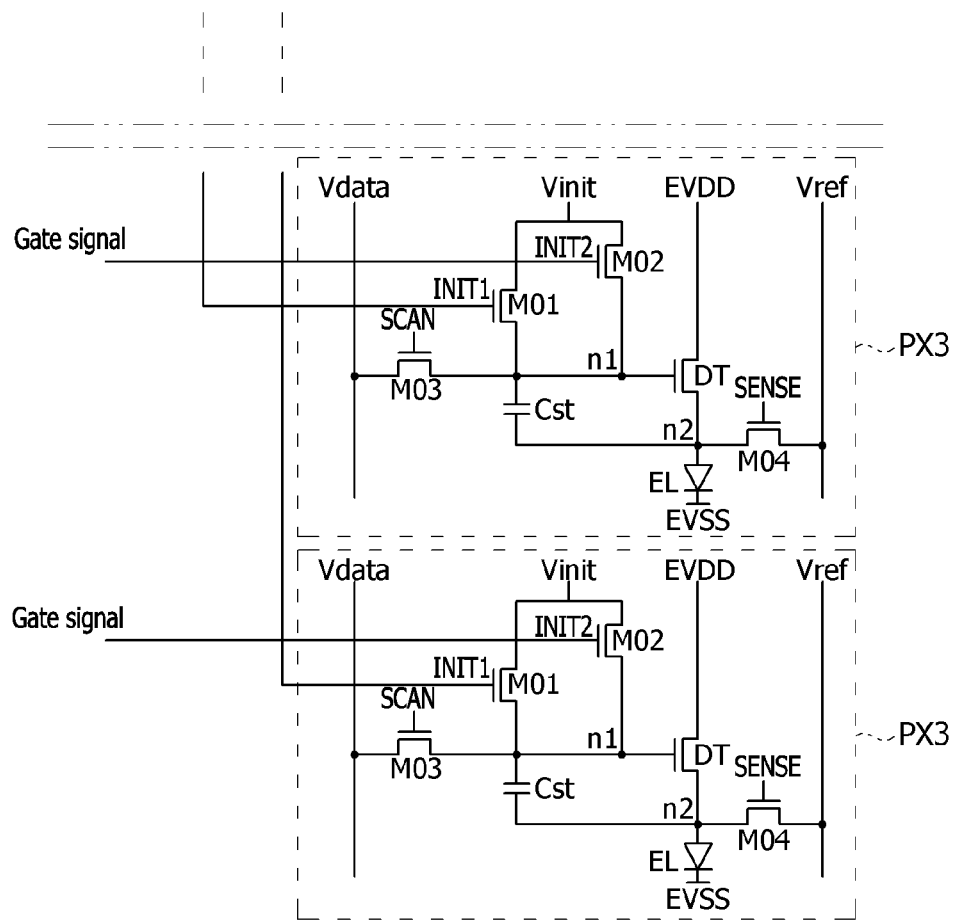

FIG. 7 is a diagram illustrating a connection relationship of a pixel circuit according to a first embodiment of the present disclosure, FIG. 8 is a diagram illustrating a driving timing of the pixel circuit shown in FIG. 7 according to the first embodiment of the present disclosure, and FIGS. 9A to 9C are diagrams illustrating a connection relationship of the pixel circuit shown in FIG. 7 according to the first embodiment of the present disclosure.

Referring to FIG. 7, a pixel circuit according to the first embodiment of the present disclosure is largely divided into three groups, namely, a first pixel group PXG1, a second pixel group PXG2, and a third pixel group PXG3 according to a connection relationship with a pixel circuit sharing the initialization pulse. In this case, respective gate lines of the first pixel group PXG1, the second pixel group PXG2, and the third pixel group PXG3 are connected to a first signal transfer group STG1, a second signal transfer group STG2, and a third signal transfer group STG3, and the initialization pulse may be applied through the gate lines. For example, the gate line of the second switch element M02 in the first pixel circuit PX1 located in the first pixel group PXG1 connects to ST1 in the first signal transfer group STG1, the gate line of the second switch element M02 in the second pixel circuit PX2 located in the second pixel group PXG2 connects to ST2 in the second signal transfer group STG2, and the gate line of the second switch element M02 in the third pixel circuit PX3 located in the third pixel group PXG3 connects to ST3 in the third signal transfer group STG3.

Here, a case of three groups is described as an example, but the present disclosure is not limited thereto. The number of groups may vary depending on an arrangement interval between pixel circuits sharing the gate line.

As shown in FIG. 8, only one initialization section may exist in the first pixel group PXG1, and two initialization sections may exist in each of the second pixel group PXG2 and the third pixel group PXG3.

The gate line through which the initialization pulse is applied to the second switch element M02 in the first pixel circuit PX1 located in the first pixel group PXG1 may be connected to the first switch element M01 in the second pixel circuit PX2 located in the second pixel group PXG2.

Referring to FIG. 9A, because the first pixel circuit PX1 located in the first pixel group PXG1 has no previous pixel line, two initialization sections do not exist and only one (e.g., a single) initialization section may exist.

The first-first gate line GL1a connected to the first switch element M01 of the first pixel circuit PX1 is in floating state in which the initialization pulse is not applied, and the second switch element M02 can be turned on in the initialization period by the initialization pulse applied through the first-second gate line GL1b.

In the initialization section, the initialization pulse is applied to the second switch element M02 in the first pixel circuit PX1, and this initialization pulse may also be applied to the first switch element M01 in the second pixel circuit PX2 located in the second pixel group PXG2.

The gate line through which the initialization pulse is applied to the second switch element M02 in the second pixel circuit PX2 located in the second pixel group PXG2 may be connected to the first switch element M01 in the third pixel circuit PX3 located in the third pixel group PXG3.

Referring to FIG. 9B, because the second pixel circuit PX2 located in the second pixel group PXG2 has the previous pixel line and the next pixel line, two initialization sections may exist.

The first switch element M01 can be turned on in the first initialization section by the initialization pulse applied through the second-first gate line GL2a, and the second switch element M02 can be turned on in the second initialization section by the initialization pulse applied through the second-second gate line GL2b.

The second-first gate line GL2a may be electrically connected to the first-second gate line GL1b.

In the first initialization section, to the first switch element M01 in the second pixel circuit PX2, the initialization pulse applied to the second switch element M02 in the first pixel circuit PX1 located in the first pixel group PXG1 may be applied.

In the second initialization section, the initialization pulse is applied to the second switch element M02 in the second pixel circuit PX2, and this initialization pulse may also be applied to the first switch element M01 in the third pixel circuit PX3 located in the third pixel group PXG3.

Because the third pixel circuit PX3 located in the third pixel group PXG3 has no next pixel line, two initialization periods do not exist and only one initialization section may exist.

Referring to FIG. 9C, the third pixel circuit PX3 located in the third pixel group PXG3 has the previous pixel line and no next pixel line, but two initialization sections may exist.

The first switch element M01 can be turned on in the first initialization section by the initialization pulse applied through the third-first gate line GL3a, and the second switch element M02 can be turned on in the second initialization section by the initialization pulse applied through the third-second gate line GL3b.

The third-first gate line GL3a may be electrically connected to the second-second gate line GL2b.

In the first initialization section, to the first switch element M01 in the third pixel circuit PX3, the initialization pulse applied to the second switch element M02 in the second pixel circuit PX2 located in the second pixel group PXG2 may be applied.

In the second initialization section, the initialization pulse may be applied to the second switch element M02 in the third pixel circuit PX3.

Because the third pixel circuit PX3 located in the third pixel group PXG3 has no next pixel line but is connected to the previous pixel line, two initialization sections may exist.

Figure 10:
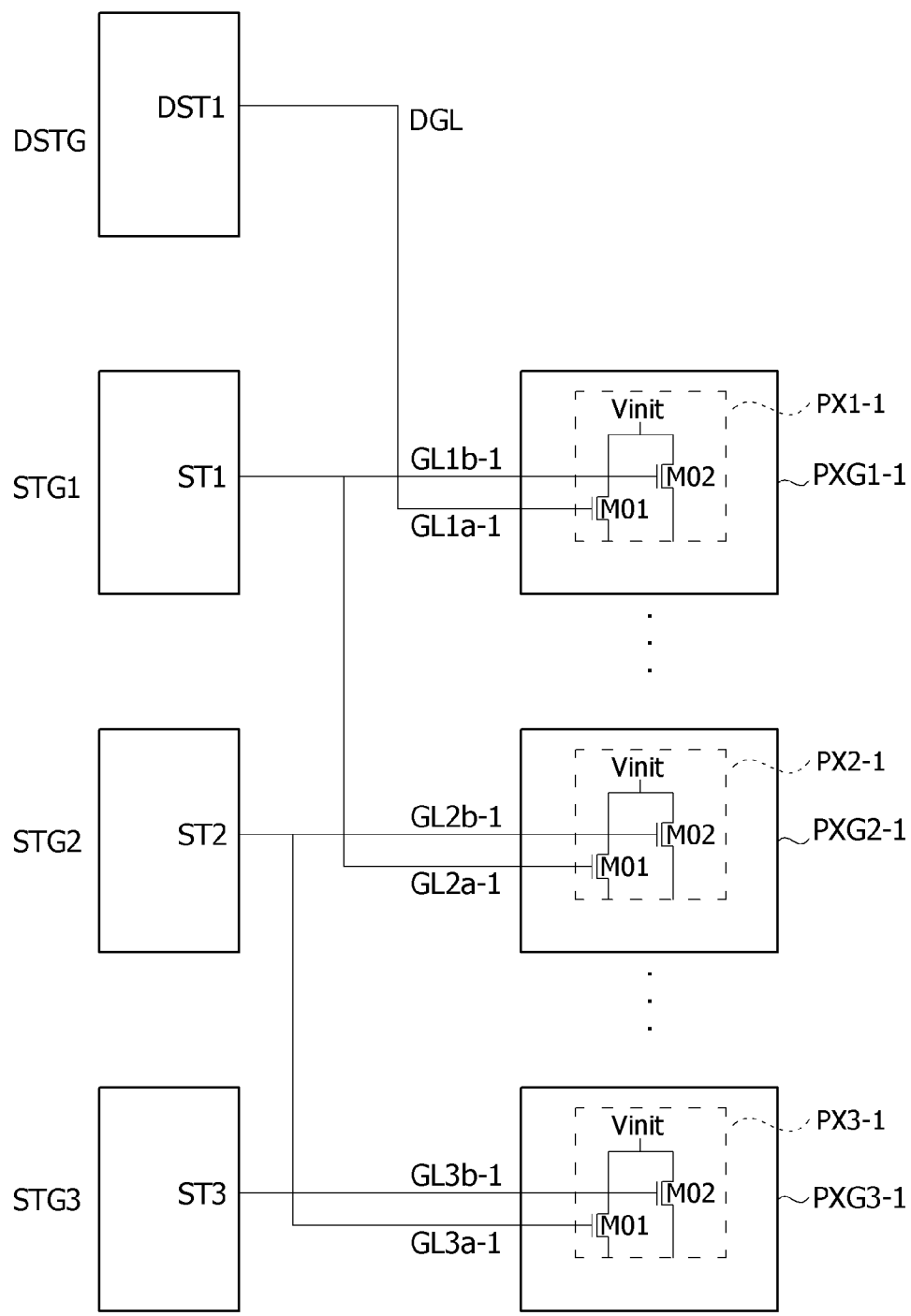
FIG. 10 is a diagram illustrating a connection relationship of a pixel circuit according to a second embodiment of the present disclosure.
Figure 11:
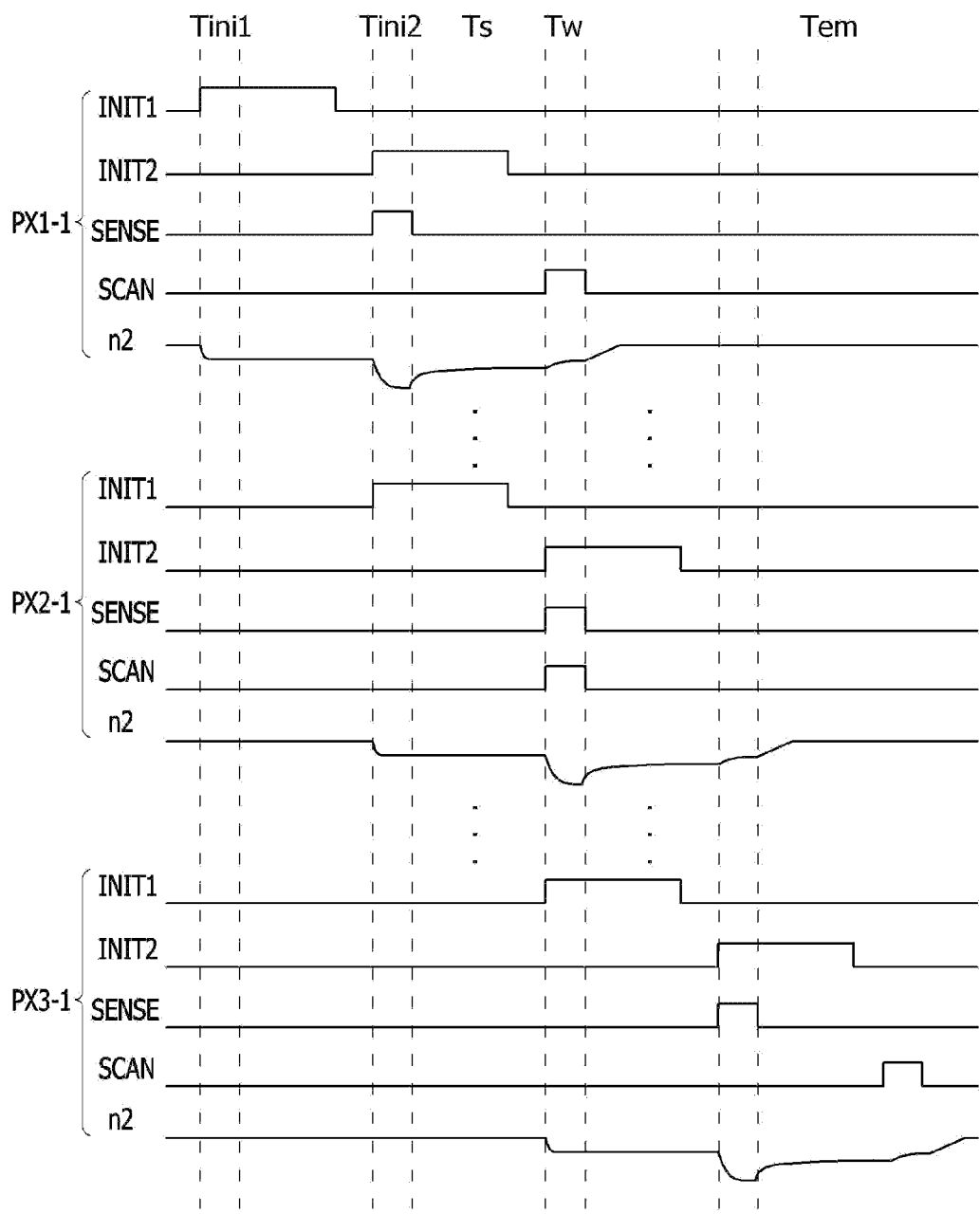
FIG. 11 is a diagram illustrating a driving timing of the pixel circuit shown in FIG. 10 according to the second embodiment of the present disclosure.
Figure 12A:
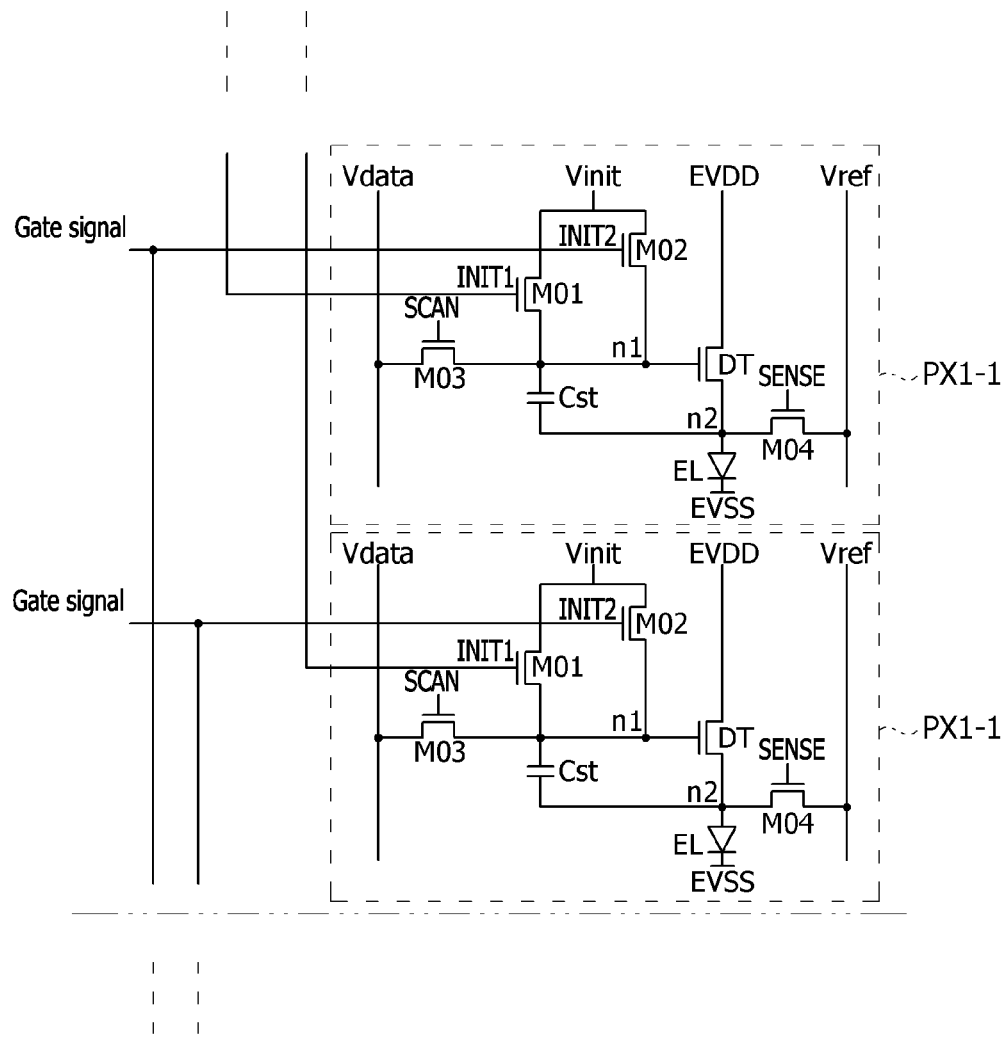
FIGS. 12A to 12C are diagrams illustrating a connection relationship of the pixel circuit shown in FIG. 10 according to the second embodiment of the present disclosure.
Figure 12B:
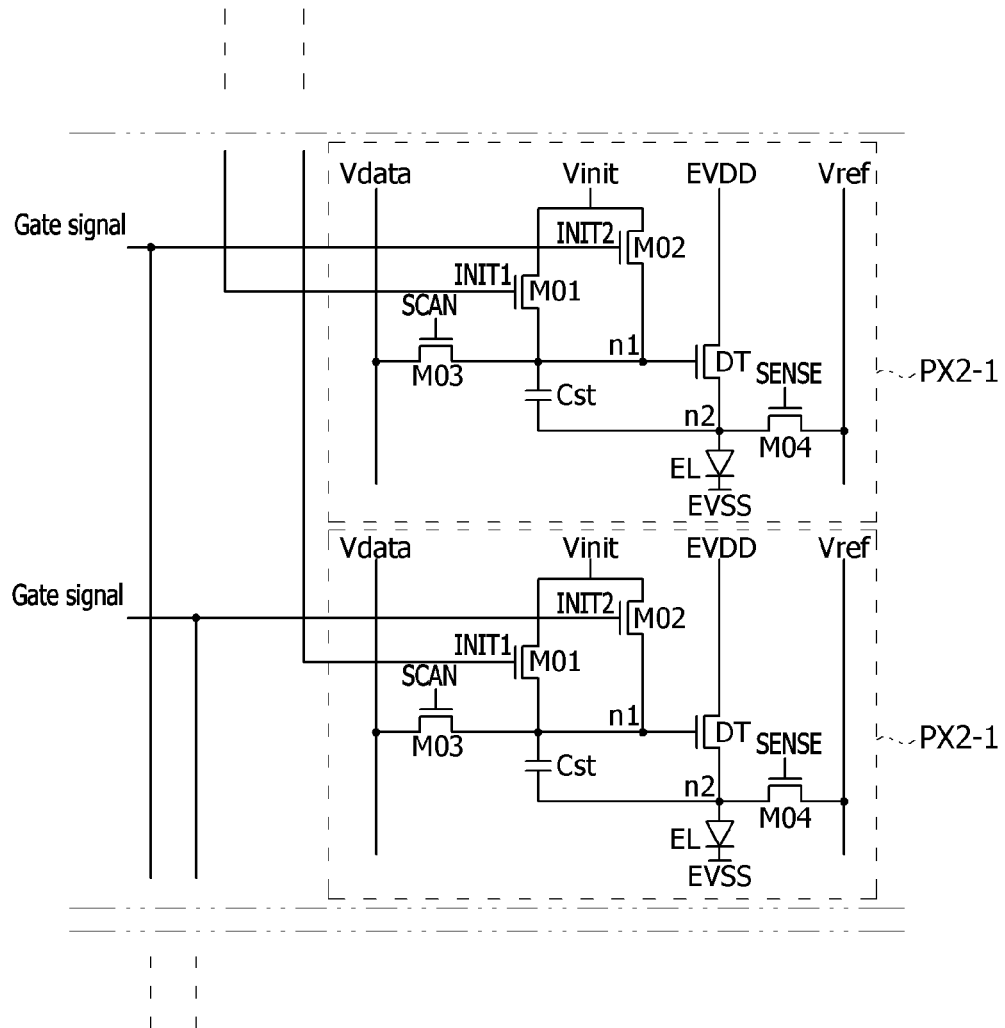
Figure 12C:
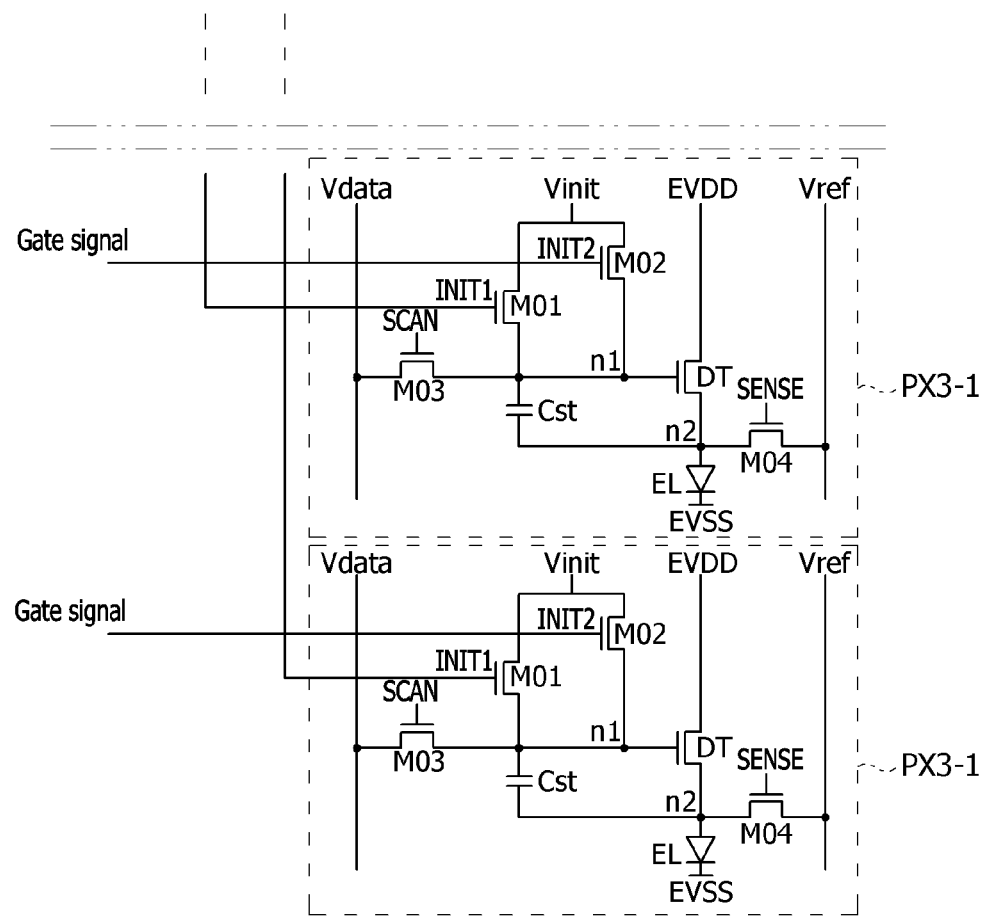

FIG. 10 is a diagram illustrating a connection relationship of a pixel circuit according to a second embodiment of the present disclosure, FIG. 11 is a diagram illustrating a driving timing of the pixel circuit shown in FIG. 10 according to the second embodiment of the present disclosure, and FIGS. 12A to 12C are diagrams illustrating a connection relationship of the pixel circuit shown in FIG. 10 according to the second embodiment of the present disclosure.

Referring to FIG. 10, a pixel circuit according to the second embodiment of the present disclosure is largely divided into three groups, namely, a first pixel group PXG1-1, a second pixel group PXG2-1, and a third pixel group PXG3-1 according to a connection relationship with a pixel circuit sharing the initialization pulse. In this case, respective gate lines of the first pixel group PXG1-1, the second pixel group PXG2-1, and the third pixel group PXG3-1 are connected to a first signal transfer group STG1, a second signal transfer group STG2, and a third signal transfer group STG3, and the initialization pulse may be applied through the gate lines.

Here, a case of three groups is described as an example, but the present disclosure is not limited thereto. The number of groups may vary depending on an arrangement interval between pixel circuits sharing the gate line.

As shown in FIG. 11, two initialization sections may exist in each of the first pixel group PXG1-1, the second pixel group PXG2-1, and the third pixel group PXG3-1.

The first switch element M01 in the first pixel circuit PX1-1 located in the first pixel group PXG1-1 is connected to a dummy gate line DGL connected to DST1 in a dummy stage DSTG, and the gate line GL1-1 through which the initialization pulse is applied to the second switch element M02 in the first pixel circuit PX1-1 may be connected to the first switch element M01 in the second pixel circuit PX2-1 located in the second pixel group PXG2-1.

Referring to FIG. 12A, because the first pixel circuit PX1-1 located in the first pixel group PXG1-1 does not have a previous pixel line, two initialization periods may exist by adding the dummy gate line connected to the dummy stage.

The first switch element can be turned on in the first initialization section by the initialization pulse applied through the first-first gate line GL1a-1, and the second switch element can be turned on in the second initialization section by the initialization pulse applied through the first-second gate line GL1b-1.

The first-first gate line GL1a-1 may be electrically connected to the dummy gate line DGL.

In the first initialization section, the initialization pulse may be applied to the first switch element M01 in the first pixel circuit PX1-1.

In the second initialization section, the initialization pulse is applied to the second switch element M02 in the first pixel circuit PX1-1, and this initialization pulse may also be applied to the first switch element M01 in the second pixel circuit PX2-1 located in the second pixel group PXG2-1.

A gate line through which the initialization pulse is applied to the second switch element M02 in the second pixel circuit PX2-1 located in the second pixel group PXG2-1 may be connected to the first switch element M01 in the third pixel circuit PX3-1 located in the third pixel group PXG3-1.

Referring to FIG. 12B, because the second pixel circuit PX2-1 located in the second pixel group PXG2-1 has the previous pixel line and the next pixel line, two initialization sections may exist.

The first switch element can be turned on in the first initialization section by the initialization pulse applied through the second-first gate line GL2a-1, and the second switch element can be turned on in the second initialization section by the initialization pulse applied through the second-second gate line GL2b-1.

The second-first gate line GL2a-1 may be electrically connected to the first-second gate line GL1b-1.

In the first initialization section, to the first switch element M01 in the second pixel circuit PX2-1, the initialization pulse applied to the second switch element M02 in the first pixel circuit PX1-1 located in the first pixel group PXG1-1 may be applied.

In the second initialization section, the initialization pulse is applied to the second switch element M02 in the second pixel circuit PX2-1, and this initialization pulse may also be applied to the first switch element M01 in the third pixel circuit PX3-1 located in the third pixel group PXG3-1.

Because the third pixel circuit PX3-1 located in the third pixel group PXG3-1 has no next pixel line, two initialization sections do not exist and only one initialization section may exist.

Referring to FIG. 12C, the third pixel circuit PX3-1 located in the third pixel group PXG3-1 has the previous pixel line and no next pixel line, but two initialization sections may exist.

The first switch element M01 can be turned on in the first initialization section by the initialization pulse applied through the third-first gate line GL3a-1, and the second switch element M02 can be turned on in the second initialization section by the initialization pulse applied through the third-second gate line GL3b-1.

The third-first gate line GL3a-1 may be electrically connected to the second-second gate line GL2b-1.

In the first initialization section, to the first switch element M01 in the third pixel circuit PX3-1, the initialization pulse applied to the second switch element M02 in the second pixel circuit PX2-1 located in the second pixel group PXG2-1 may be applied.

In the second initialization section, the initialization pulse may be applied to the second switch element M02 in the third pixel circuit PX3-1.

Because the third pixel circuit PX3-1 located in the third pixel group PXG3-1 has no next pixel line but is connected to the previous pixel line, all two initialization sections may exist.

Although the embodiments of the present disclosure have been described in more detail with reference to the accompanying drawings, the present disclosure is not limited thereto and may be embodied in many different forms without departing from the technical concept of the present disclosure. Therefore, the embodiments disclosed in the present disclosure are provided for illustrative purposes only and are not intended to limit the technical concept of the present disclosure. The scope of the technical concept of the present disclosure is not limited thereto. Therefore, it should be understood that the above-described embodiments are illustrative in all aspects and do not limit the present disclosure. The protective scope of the present disclosure should be construed based on the following claims, and all the technical concepts in the equivalent scope thereof should be construed as falling within the scope of the present disclosure.

What is claimed is:

1. A pixel circuit comprising:
    a first pixel circuit connected in parallel to an initialization voltage line to which an initialization voltage is applied, the first pixel circuit including a first-first switch element connected to a first-first gate line and a first-second switch element connected to a first-second gate line; and
    a second pixel circuit connected in parallel to the initialization voltage line, the second pixel circuit including a second-first switch element connected to a second-first gate line and a second-second switch element connected to a second-second gate line,
    wherein the first-second gate line and the second-first gate line are electrically connected.

2. The pixel circuit of claim 1, wherein the first pixel circuit includes a first driving element, the first-first switch element, the first-second switch element, a first-third switch element, and a first-fourth switch element,
    the first driving element includes a first electrode of the first driving element that is connected to a pixel driving voltage line, a gate electrode of the first driving element that is connected to a first-first node, and a second electrode of the first driving element that is connected to a first-second node,
    the first-first switch element includes a first electrode of the first-first switch element that is connected to the initialization voltage line, a gate electrode of the first-first switch element that is connected to the first-first gate line, and a second electrode of the first-first switch element that is connected to the first-first node,
    the first-second switch element includes a first electrode of the first-second switch element that is connected to the initialization voltage line, a gate electrode of the first-second switch element that is connected to the first-second gate line, and a second electrode of the first-second switch element that is connected to the first-first node,
    the first-third switch element includes a first electrode of the first-third switch element that is connected to a data voltage line, a gate electrode of the first-third switch element to which a scan pulse is applied, and a second electrode of the first-third switch element that is connected to the first-first node, and
    the first-fourth switch element includes a first electrode of the first-fourth switch element that is connected to the first-second node, a gate electrode of the first-fourth switch element to which a sensing pulse is applied, and a second electrode of the first-fourth switch element that is connected to a reference voltage line.

3. The pixel circuit of claim 2, wherein in the first pixel circuit,
    the first-first gate line is in a floating state, and
    responsive to an initialization pulse that is applied to the first-second gate line in an initialization section, the first-second switch element is turned on to apply the initialization voltage to the first-first node.

4. The pixel circuit of claim 2, wherein the first-first gate line is connected to a dummy gate line,
    responsive to an initialization pulse that is applied from the dummy gate line in a first initialization section, the first-first switch element is turned on to firstly apply the initialization voltage to the first-first node, and
    responsive to the initialization pulse that is applied to the first-second gate line in a second initialization section, the first-second switch element is turned on to secondly apply the initialization voltage to the first-first node.

5. The pixel circuit of claim 2, wherein the second pixel circuit includes a second driving element, the second-first switch element, the second-second switch element, a second-third switch element, and a second-fourth switch element,
    the second driving element includes a first electrode of the second driving element that is connected to a pixel driving voltage line, a gate electrode of the second driving element that is connected to a second-first node, and a second electrode of the second driving element that is connected to a second-second node, the second-first switch element includes a first electrode of the second-first switch element that is connected to the initialization voltage line, a gate electrode of the second-first switch element that is connected to the second-first gate line, and a second electrode of the second-first switch element that is connected to the second-first node, the second-second switch element includes a first electrode of the second-second switch element that is connected to the initialization voltage line, a gate electrode of the second-second switch element that is connected to the second-second gate line, and a second electrode of the second-second switch element that is connected to the second-first node, the second-third switch element includes a first electrode of the second-third switch element that is connected to a data voltage line, a gate electrode of the second-third switch element to which a scan pulse is applied, and a second electrode of the second-third switch element that is connected to the second-first node, and the second-fourth switch element includes a first electrode of the second-fourth switch element that is connected to the second-second node, a gate electrode of the second-fourth switch element to which a sensing pulse is applied, and a second electrode of the second-fourth switch element that is connected to a reference voltage line.

6. The pixel circuit of claim 5, wherein the second-second gate line is electrically connected to a gate line of a next pixel line, responsive to an initialization pulse that is applied to the first-second gate line in a first initialization section, the second-first switch element is turned on to firstly apply an initialization voltage to the second-first node, and responsive to the initialization pulse that is applied to the second-second gate line in a second initialization section, the second-second switch element is turned on to secondly apply the initialization voltage to the second-first node.

7. The pixel circuit of claim 5, wherein the second-second gate line is not electrically connected to a gate line of a next pixel line, responsive to an initialization pulse that is applied to the first-second gate line in a first initialization section, the second-first switch element is turned on to firstly apply an initialization voltage to the second-first node, and responsive to an initialization pulse that is applied to the second-second gate line in a second initialization section, the second-second switch element is turned on to apply the initialization voltage to the second-first node.

8. The pixel circuit of claim 1, wherein the second pixel circuit is spaced apart from the first pixel circuit by a predetermined number k of pixel lines, wherein k is a positive integer.

9. The pixel circuit of claim 8, wherein the k is an integer greater than or equal to a value obtained by dividing an initialization time by a time of one horizontal period.

10. A display device comprising:
a display panel comprising a plurality of sub-pixels,
wherein each of the plurality of sub-pixels includes:
a first pixel circuit connected in parallel to an initialization voltage line to which an initialization voltage is applied, the first pixel circuit including a first-first switch element connected to a first-first gate line and a first-second switch element connected to a first-second gate line; and a second pixel circuit connected in parallel to the initialization voltage line, the second pixel circuit including a second-first switch element connected to a second-first gate line and a second-second switch element connected to a second-second gate line, wherein the first-second gate line and the second-first gate line are electrically connected.

11. The display device of claim 10, wherein the first pixel circuit includes a first driving element, the first-first switch element, the first-second switch element, a first-third switch element, and a first-fourth switch element, the first driving element includes a first electrode of the first driving element that is connected to a pixel driving voltage line, a gate electrode of the first driving element that is connected to a first-first node, and a second electrode of the first driving element that is connected to a first-second node, the first-first switch element includes a first electrode of the first-first switch element that is connected to the initialization voltage line, a gate electrode of the first-first switch element that is connected to the first-first gate line, and a second electrode of the first-first switch element that is connected to the first-first node, the first-second switch element includes a first electrode of the first-second switch element that is connected to the initialization voltage line, a gate electrode of the first-second switch element that is connected to the first-second gate line, and a second electrode of the first-second switch element that is connected to the first-first node, the first-third switch element includes a first electrode of the first-third switch element that is connected to a data voltage line, a gate electrode of the first-third switch element to which a scan pulse is applied, and a second electrode of the first-third switch element that is connected to the first-first node, and the first-fourth switch element includes a first electrode of the first-fourth switch element that is connected to the first-second node, a gate electrode of the first-fourth switch element to which a sensing pulse is applied, and a second electrode of the first-fourth switch element that is connected to a reference voltage line.

12. The display device of claim 11, wherein in the first pixel circuit,
the first-first gate line is in a floating state, and
responsive to an initialization pulse that is applied to the first-second gate line in an initialization section, the first-second switch element is turned on to apply the initialization voltage to the first-first node.

13. The display device of claim 11, wherein the first-first gate line is connected to a dummy gate line,
responsive to an initialization pulse that is applied from the dummy gate line in a first initialization section, the first-first switch element is turned on to firstly apply the initialization voltage to the first-first node, and
responsive to the initialization pulse that is applied to the first-second gate line in a second initialization section, the first-second switch element is turned on to secondly apply the initialization voltage to the first-first node.

14. The display device of claim 11, wherein the second pixel circuit includes a second driving element, the second-first switch element, the second-second switch element, a second-third switch element, and a second-fourth switch element, the second driving element includes a first electrode of the second driving element that is connected to a pixel driving voltage line, a gate electrode of the second driving element that is connected to a second-first node, and a second electrode of the second driving element that is connected to a second-second node, the second-first switch element includes a first electrode of the second-first switch element that is connected to the initialization voltage line, a gate electrode of the second-first switch element that is connected to the second-first gate line, and a second electrode of the second-first switch element that is connected to the second-first node, the second-second switch element includes a first electrode of the second-second switch element that is connected to the initialization voltage line, a gate electrode of the second-second switch element that is connected to the second-second gate line, and a second electrode of the second-second switch element that is connected to the second-first node, the second-third switch element includes a first electrode of the second-third switch element that is connected to a data voltage line, a gate electrode of the second-third switch element to which a scan pulse is applied, and a second electrode of the second-third switch element that is connected to the second-first node, and the second-fourth switch element includes a first electrode of the second-fourth switch element that is connected to the second-second node, a gate electrode of the second-fourth switch element to which a sensing pulse is applied, and a second electrode of the second-fourth switch element that is connected to a reference voltage line.

15. The display device of claim 14, wherein the second-second gate line is electrically connected to a gate line of a next pixel line, responsive to an initialization pulse that is applied to the first-second gate line in a first initialization section, the second-first switch element is turned on to firstly apply an initialization voltage to the second-first node, and responsive to the initialization pulse that is applied to the second-second gate line in a second initialization section, the second-second switch element is turned on to secondly apply the initialization voltage to the second-first node.

16. The display device of claim 14, wherein the second-second gate line is not electrically connected to a gate line of a next pixel line, responsive to an initialization pulse that is applied to the first-second gate line in a first initialization section, the second-first switch element is turned on to firstly apply an initialization voltage to the second-first node, and responsive to the initialization pulse that is applied to the second-second gate line in a second initialization section, the second-second switch element is turned on to apply the initialization voltage to the second-first node.

17. The display device of claim 10, wherein the second pixel circuit is spaced apart from the first pixel circuit by a predetermined number k of pixel lines, wherein k is a positive integer.

18. The display device of claim 17, wherein the k is an integer greater than or equal to a value obtained by dividing an initialization time by a time of one horizontal period.

19. The display device of claim 10, wherein transistors included in the display panel comprise oxide thin film transistors (TFTs) including an n-channel type oxide semiconductor.

20. The display device of claim 10, wherein the display panel further comprises:

a plurality of data lines, a plurality of gate lines that intersect with the plurality of data lines, and a plurality of power lines to which different constant voltages are applied, and the display device further comprises:

a data driver configured to supply a data voltage of pixel data to the plurality of data lines; and a gate driver configured to supply a gate signal to the plurality of gate lines.

21. A pixel circuit comprising:

a first switch element and a second switch element that are connected in parallel to an initialization voltage line, an initialization voltage applied to the initialization voltage line, wherein the first switch element and the second switch element are applied with an initialization pulse, and the pixel circuit is configured to share the initialization pulse with another pixel circuit which is spaced apart from the pixel circuit by a predetermined number of pixel lines.

* * * * *